United States Patent [19]

Marcantonio

[11] Patent Number: 5,796,170
[45] Date of Patent: Aug. 18, 1998

[54] BALL GRID ARRAY (BGA) INTEGRATED CIRCUIT PACKAGES

[75] Inventor: Gabriel Marcantonio, Nepean, Canada

[73] Assignee: Northern Telecom Limited, Montreal, Canada

[21] Appl. No.: 601,667

[22] Filed: Feb. 15, 1996

[51] Int. Cl.$^6$ .......................... H01L 23/48; H01L 23/52; H01L 29/40
[52] U.S. Cl. .......................... 257/786; 257/780; 257/779; 257/691; 257/693
[58] Field of Search .......................... 257/691, 738, 257/659, 780, 781, 786, 706, 779, 698, 693

[56] References Cited

U.S. PATENT DOCUMENTS 4,954,877  9/1990  Nakanishi et al. .......................... 257/659
5,371,404  12/1994  Juskey .......................... 257/659

*Primary Examiner*—Jerome Jackson
*Assistant Examiner*—S. V. Clark
*Attorney, Agent, or Firm*—Angela C. de Wilton

[57] ABSTRACT

An improved ball grid array (BGA) package having EMI shielding is provided. In a BGA package a thermally conductive heat spreader provided by a conductive layer, and an electrical interconnection is provided between the electrically conductive heat spreader and solder balls of the array, for example by plated through holes extending through the dielectric body of the package. Thus in use of the package, when contacts are made from the array of solder balls to a corresponding array of contact areas of a substrate, a ground connection is simultaneously provided to the heat spreader through the solder balls. For example, one or more conductive contacts on the substrate may be connected to a ground plane of the substrate, and a corresponding solder balls of the package are interconnected to the heat spreader. Beneficially, the ground connection is provided by external rows of solder balls of the array extending around sides of package, or by clusters of solder balls surrounding balls for carrying signals. Thus by providing integral ground connections, the heat spreader of the BGA package functions also a Faraday shield providing for improved shielding of electromagnetic interference.

14 Claims, 4 Drawing Sheets

FIG. 8

BALL GRID ARRAY (BGA) INTEGRATED CIRCUIT PACKAGES

FIELD OF INVENTION

This invention relates to improvements in a BGA integrated circuit package, and particularly to EMI shielding for a BGA integrated circuit package.

BACKGROUND OF THE INVENTION

Conventionally, an integrated circuit package provides for electrical connections from an integrated circuit chip to external conductors, and for protection of the chip from the external environment. Additionally, management of electromagnetic emission and thermal dissipation are increasingly important considerations in the development of improved packaging for integrated circuits chips, as described in U.S. Pat. No. 5,294,826 to the present inventor.

Large integrated circuits, for example, application specific integrated circuits (ASICs) used in telecommunications and other applications, may dissipate powers in excess of several Watts. Consequently, it may be necessary to provide an integrated circuit package with a heat sink. Conventionally a heat sink for a packaged integrated circuit may be provided by mounting the chip in thermal contact with a slug of thermally conductive metal or alloy having an exposed surface for dissipation of heat. Where greater heat dissipation is required, a heat sink may be provided with fins extending laterally of the package, to increase the exposed surface area for heat dissipation. However, the latter structure, of course, adds considerably to the size of the package.

To prevent electromagnetic interference (EMI) from unwanted radiated emissions generated by integrated circuits in electronic equipment, electromagnetic shielding of electronic systems may be required to meet various regulatory standards. Addition of shielding to meet increasingly stringent international regulations and standards for controlling electromagnetic interference EMI, e.g. FCC requirements, may add significant cost to a system.

With the continued drive towards reducing the dimensions of integrated circuit packages, conventional packaging techniques are severely challenged in providing both effective heat dissipation or control of electromagnetic interference in a readily manufacturable and reliable package.

One type of package which is now of significant interest for high lead count integrated circuits, e.g. Application Specific Integrated Circuits (ASICs) for telecommunications applications, is a Ball Grid Array (BGA) package. This type of package in now available commercially from a number of suppliers in various forms for cavity-up or cavity-down configurations. The terminals take the form of arrays of eutectic solder balls. The solder balls are aligned with corresponding contact pad areas on a substrate, and heated to form contacts directly with the substrate, which allow for a high density of compact and reliable interconnections. The BGA package body may comprise a polymer, e.g. polyimide, or ceramic dielectric body. Optionally a BGA package may include a heat spreader for example in the form of a heat slug, which is typically copper, or another thermally conductive metal or alloy. Another type of BGA is known as a metal BGA (MBGA) which comprise a heat slug of an anodized metal, e.g. aluminum or copper which forms a substrate of the package.

For a number of telecommunications applications, integrated circuit chips for backplanes may be capacitively coupled to received signals. Thus these chips also tend to be sensitive to RF interference, and spacing between chips must be sufficiently large to reduce EMI. While existing BGA packages provide for many requirements, including high lead count, heat dissipation and reliability for packaging of these chips, existing BGA packages do not provide sufficient EMI shielding for this type of application. Additional EMI shielding in the form of grounded metal covers may be provided, not only significantly increasing costs, but also adding bulk to the packaging. For some applications there is not sufficient space to house separate additional shielding around the package.

SUMMARY OF THE INVENTION

The present invention seeks to provide an improved BGA package for integrated circuits for control of electromagnetic interference.

Thus according to one aspect of the present invention there is provided a ball grid array package for an integrated circuit comprising a dielectric body, an array of solder balls, and a heat spreader comprising a layer of a thermally conductive material, the heat spreader also being electrically conductive, and comprising a conductive interconnection provided between the heat spreader and solder balls of the ball grid array, for providing a ground connection through the solder balls.

Advantageously, the conductive interconnection comprises a conductively plated through hole which conductively interconnects the heat spreader and a conductive contact to the solder balls. Thus the heat spreader may be interconnected conveniently to a grounding connection to provide Faraday shielding for the BGA package. For example, the heat spreader comprises a layer of material having a high thermal conductivity, for example, a metal such as copper or copper alloy extending over the surface of the package. This material is also electrically conductive, and thus a the heat spreader may be reliably grounded through one or more of the solder balls.

Alternative forms of interconnection between the heat spreader and solder balls comprises pins or a conductive connection formed by edge plating to achieve electrical connection between the solder balls to the internal conducting layers and the heat spreader or heat slug. Side plating is a particularly cost effective method of adapting known package configurations.

The ground connection for the heat spreader is made at the same time as other interconnections, via the solder balls. A Faraday shield may be provided without need to provide separate grounding connections. A reliable ground connection is provided when package is attached to the substrate in the usual course of assembly. Furthermore, not only is the substrate area reduced relative to a conventional metal shield provided over the IC package, space required to provide external grounding connections is eliminated.

Beneficially, external rows of solder balls of the array provide for grounding connections to the heat spreader to extend around the package to provide an effective grounded Faraday shield. Alternatively, Faraday shielding may be provided selectively around single lines by providing grounding connections thorough selected rows or clusters of solder balls surrounding balls carrying signals.

According to another aspect of the invention there is provided a ball grid array package for an integrated circuit comprising: a heat spreader comprising a thermally and electrically conductive material; a body of the package for enclosing an integrated circuit chip in thermal contact with the heat spreader on one side of the body; and disposed on an opposite side of the body a metallization layer defining conductive leads on which is disposed an array of solder balls, conductive interconnections extending through the body to lead bond pads for the integrated circuit; wherein the improvement comprises a conductive interconnection extending between the heat spreader and the array of solder balls for interconnection of the heat spreader to a ground connection through the solder balls.

The resulting Faraday shielded BGA package is applicable to cavity up or cavity down configurations, with an integral heat spreader or an attached heat spreader in the form of a metal slug. The latter for example includes a cavity down slug BGA.

According to another aspect of the present invention there is provided an assembly of a ball grid array package, an integrated circuit, and a substrate comprising a conductive layer providing a ground plane, comprises: the integrated circuit enclosed within a body of the ball grid array package, a heat spreader disposed on one side of the body, the heat spreader being in thermal contact with the integrated circuit; conductive interconnections extending from contacts pads of the integrated circuit though conductive leads of the ball grid array package to corresponding solder balls of the ball grid array, each solder ball being conductively interconnected with a corresponding one of an array of bond pads provided on the substrate, and the heat spreader being interconnected through conductive leads and the solder balls to a ground plane of the substrate.

Thus beneficially, a grounding connection is reliably provided at the same time, and preferably in the same manner as other connections of the IC package to the substrate.

BRIEF DESCRIPTION OF THE DRAWINGS

Embodiments of the invention will now be described by way of example, with reference to the accompanying drawings, in which:

FIG. 8 shows a schematic plan view of the array of solder balls of a BGA package according to another embodiment of the present invention illustrating an arrangement of ground connections to provide Faraday shielding selectively around signal pairs.

DESCRIPTION OF THE PREFERRED EMBODIMENTS

Figure 1:
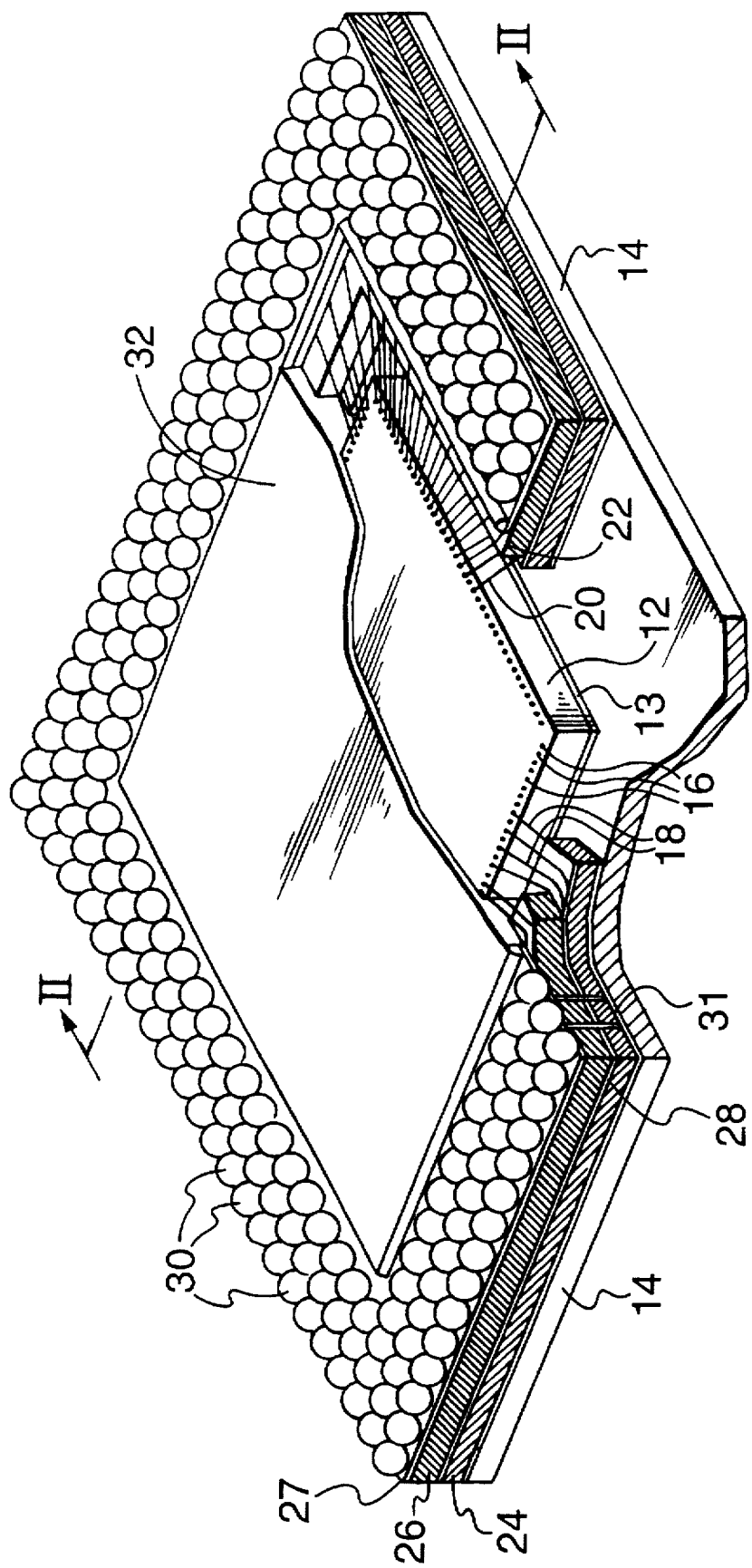
FIG. 1 shows a schematic, oblique view, partially cut away, diagram of a ball grid array package of the type known as a SuperBGA™ which is made by Amkor/Anam.
Figure 2:
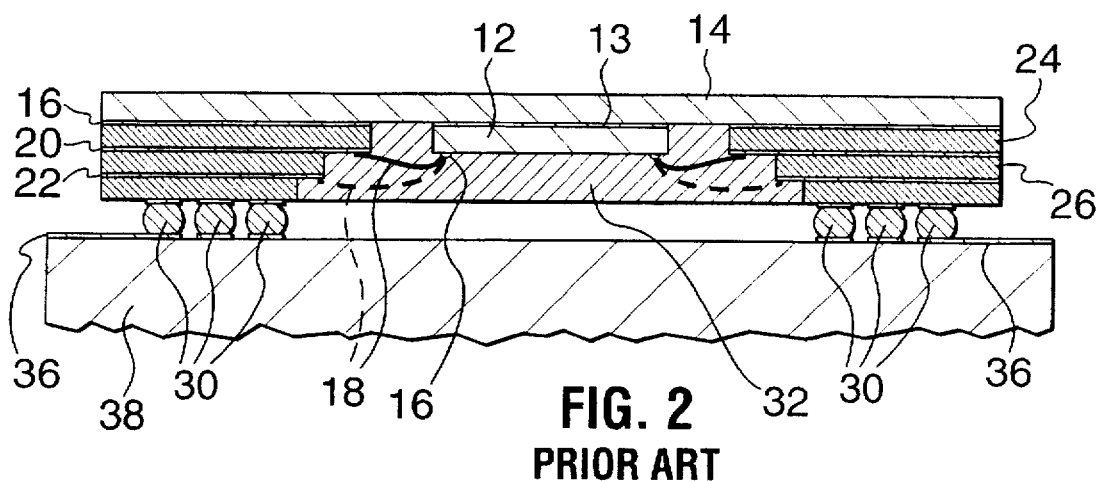
FIG. 2 shows an enlarged cross-sectional view through part of a conventional prior art BGA package.

An oblique, partially cut away view of a known commercially available ball grid array package for an integrated circuit is shown in FIG. 1 and a cross-sectional view through section II—II of FIG. 1 is shown in FIG. 2. For example, one such a package is known as the SuperBGA™, manufactured by Amkor/Anam. The package 10 for an integrated circuit 12 comprises a thermally conductive heat spreader 14, which is typically a layer of metal, such as thin sheets or thick slug of a metal such as copper, to which the integrated circuit 12 is bonded by a thermally conductive die attach adhesive medium 13. Bond pads 16 of the integrated circuit are electrically connected via electrically conductive leads 18 to conductive traces 20 defined by an electrical conductive layer 28 within the dielectric body of the package indicated by dielectric layers 24 and 26 of the dielectric body, i.e. a structure similar to that used in printed wiring board technology. The heat spreader 14 is bonded to one side of the dielectric body. On the opposite side of the dielectric body there is provided a conductive layer 27 defining conductive traces on which is disposed an array of eutectic solder balls 30. Conductive vias 31 extend through the layer 24 and 26 forming the dielectric body to provide for electrical interconnections between the solder balls 30 and the contact pads 16 of the integrated circuit. A layer of encapsulate 32 encloses and protects the integrated circuit 12.

The cross-sectional diagram through part of the BGA in FIG. 2 shows how the package is interconnected to the substrate 38 via ball bonds formed by thermal reflow of the solder balls 30 to form connections to corresponding individual contact pads 36 on the substrate. This package has one or more levels of metal interconnections, e.g. 120 and 122, in a cavity down configuration.

Figure 3:
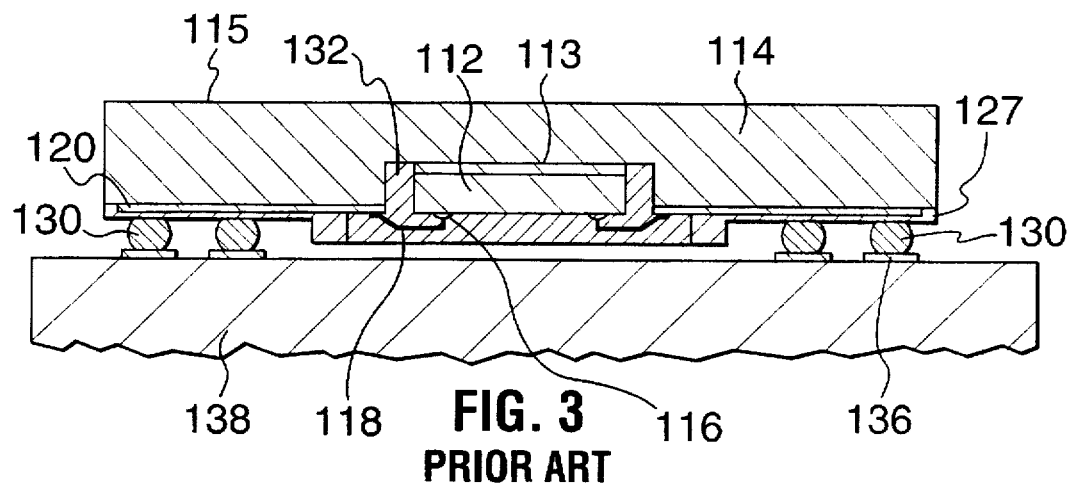
FIG. 3 shows a cross-sectional view through another known type of BGA package known as a metal ball grid array (MBGA) package.

Another known type of BOA 100, known as a metal BGA (MBGA) is shown in FIG. 3, and comprises a metal substrate which also serves as a heat spreader 114. The heat spreader 114 is formed from such materials as anodized aluminum or oxidized copper, the anodization forming a layer 115 coating the metal substrate. Other parts of this cavity down, single tier MBGA are similar to those of the BGA in FIG. 2, and for simplicity in comparing the two structures are labeled with the same reference numerals incremented by 100.

Figure 4:
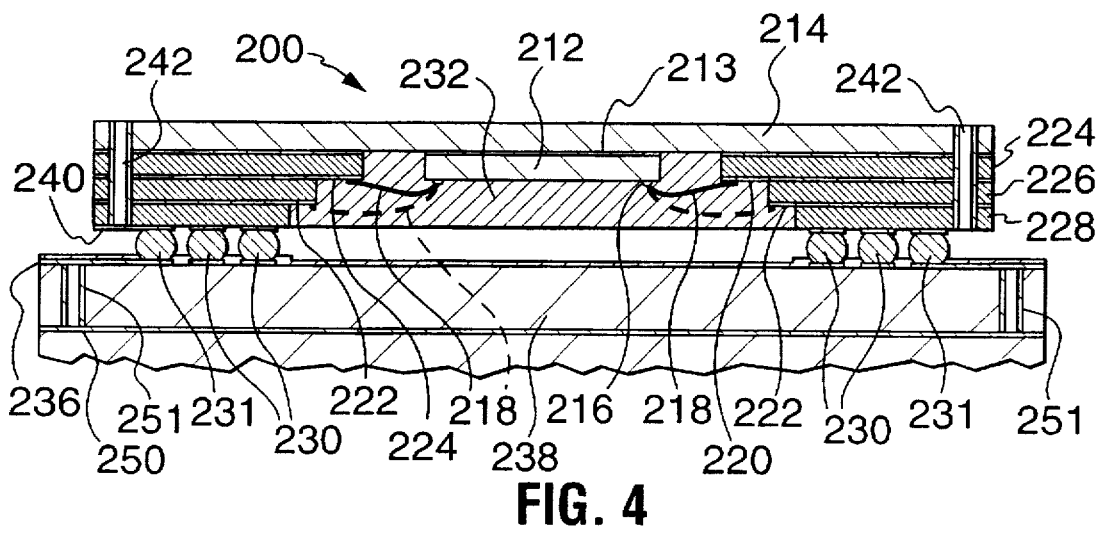
FIG. 4 shows an cross-sectional view through part of a BGA package according to a first embodiment of the present invention.

A cross-sectional diagram through part of a BGA package 200 according to a first embodiment of the present invention is shown in FIG. 4. In many respects the package of the embodiment is similar to that shown in FIG. 2. That is, the BGA package 200 encloses an integrated circuit chip 212, face down in thermal contact with a heat spreader 214, attached with a layer of thermally conductive material 213. The heat spreader 214 is provided on one side of the dielectric body of the package, which comprises layers 224, 226, and 228. Electrically conductive leads 218 interconnect the bond pads 216 of the integrated circuit with electrically conductive traces provided by two tiers of conductive layers 220 and 222 extending through the dielectric body. Another electrically conductive layer 240 is provided on the opposite surface of the dielectric body and defines conductive traces on which are disposed an array of solder balls 230. Electrically conductive vias (for simplicity not shown in this figure) extend through the dielectric body to interconnect the solder balls with the conductive traces within the dielectric body. The feature which differentiates the BGA package from conventional known BCA packages is the conductive interconnection 242, in the form of a plated throughhole, which provides for electrical connection of the heat spreader 214 to selected solder balls 231 of the array. The heat spreader 214 is provided by a thermally conductive material which is also electrically conductive, for example a layer of copper or copper alloy. As shown in FIG. 4, the heat spreader is electrically connected through the selected solder balls 231 to a ground plane 250 of the substrate 238, i.e. through an electrical interconnection layer 236 of the substrate and plated through holes 251. Thus the heat spreader 214 is conveniently grounded, and thereby functions as a Faraday cage to provide EMI shielding. This package may therefore be referred to as a "Faraday BGA package" (FBGA). Conveniently, the ground connection is made at the same time, and in the same manner, as the other interconnections to the substrate, i.e., by reflow of the solder balls of the array. Thus a reliable ground connection is provided without additional assembly steps.

Beneficially, selected solder balls 231 providing for the ground connection include the external rows of solder balls along sides of the package, and surrounding internal rows of solder balls 230 for carrying signals. Thus the signal lines are effectively enclosed by the Faraday shield comprising the heat spreader and the grounding connections.

Figure 8:
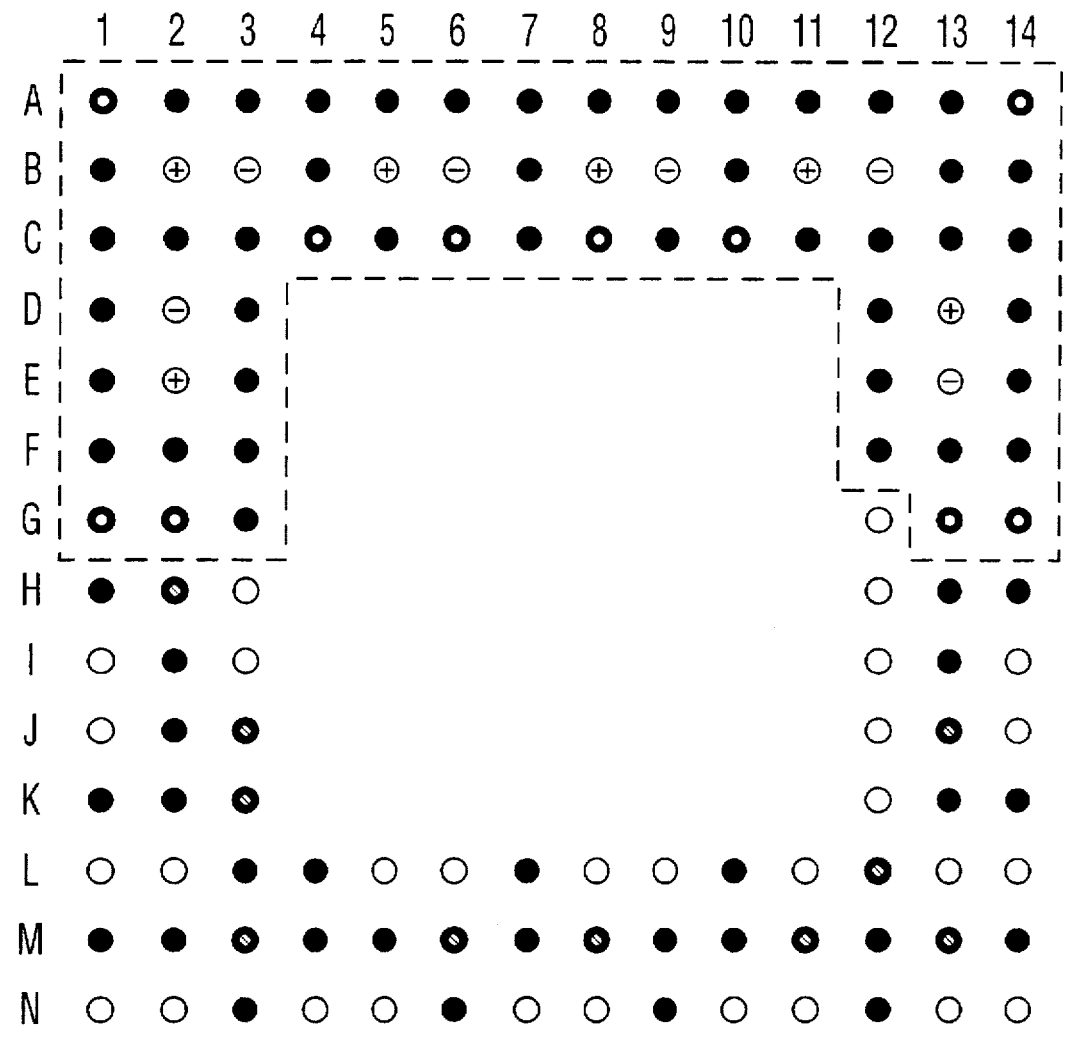

Alternatively, where the required number of I/Os for signals limits the number of solder balls available for making grounding connections, rather than grounding all external rows of balls, rows of solder balls on selected sides of the array, e.g. along three sides of the package body, may provide for grounding, and rows on other sides provide for signals. In other variations, grounding of selected clusters or groups of solder balls surrounding balls carrying signals provides for selectively shielding signal lines. Grounding may be provided alternatively by internal groups or rows of solder balls of the array, as required, as shown schematically in FIG. 8, wherein balls shown as solid back represent ground connections, which surround signal pairs marked + and −. Thus, as shown in dotted outline, a Faraday shield is provided around signal I/Os e.g. solder balls D2/E2 and D13/E13 which are surrounded by ground connections (black).

The EMI shielded package is provided in a reduced area relative to that occupied by a chip having an additional conventional grounded metal shielding provided over the package, and avoids the need for additional external grounding posts to be provided in a separate assembly step. Thus, the resulting package is cost effective and provides for compact Faraday shielding.

Figure 5:
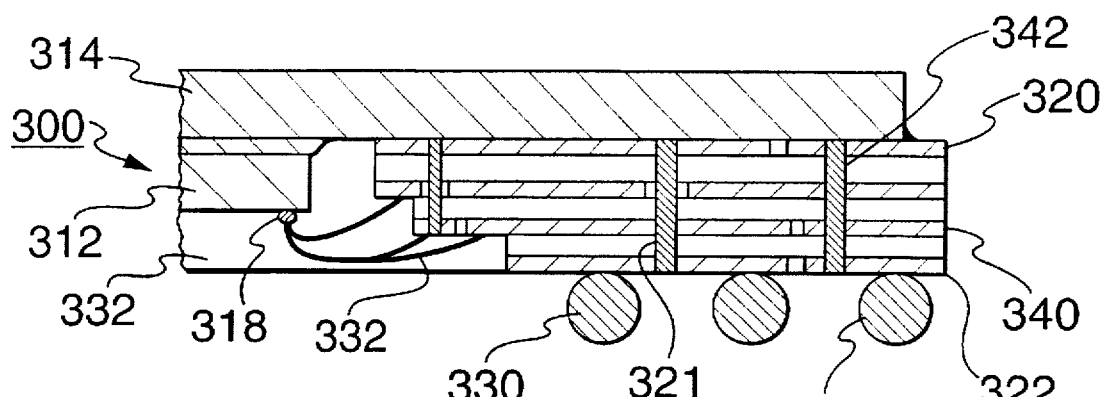
FIG. 5 shows a cross-sectional view through part of a BGA package according to a second embodiment of the present invention.
Figure 6:
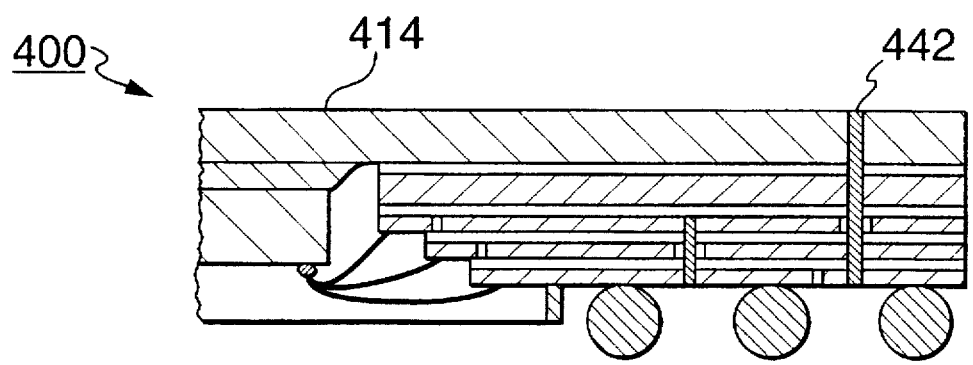
FIG. 6 shows a cross-sectional view through part of a BGA package according to a third embodiment of the present invention.
Figure 7:
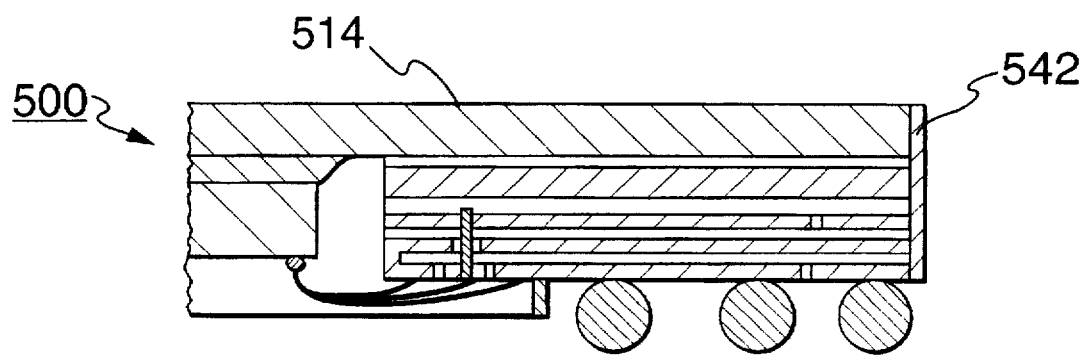
FIG. 7 shows a cross-sectional view through part of a BGA package according to an fourth embodiment of the present invention.

While the embodiment described above includes an integral heat spreader provided as part of the package, packages according to alternative embodiments are provided with separate bonded heat spreaders i.e. in the form of a bonded copper slug, and/or alternative conductive means for interconnecting a heat spreader or heat slug to solder balls of the package, as shown in FIGS. 5 to 7.

Thus in a BGA package 300 according to a second embodiment shown in part in FIG. 5 a separate heat spreader 314 is provided in the form of a copper slug 314 which is soldered to the package body. This embodiment comprises ground connections 342 as shown, interconnecting the copper slug 314 and solder balls 331. Parts of interconnect layers 322 also provide for a Vss end ring shields. Interconnect vias 321 extend between the interconnect layers 320 and 322.

Another package 400 according to a third embodiment, also based on a super BGA configuration is shown in FIG. 9. The latter differs from that of the first embodiment only in the configurations of the internal interconnection layers. The ground connection 442 for the heat spreader 414 is provided by a conductively plated through hole similar to that of the first embodiment.

In other packages according to alternative embodiments the interconnection between the heat spreader and the solder balls of the package are provided by conductive pins or side plating to achieve electrical connection from the solder balls to the internal conducting layers, and to the heat spreader or heat slug. A package 500 of an embodiment comprising the latter type of connection, that is conductive side plating 542 for grounding the heat spreader 514 is shown schematically in FIG. 7. Thus grounding of the heat spreader and conductive side plating 542 conveniently provides for effective Faraday shielding around sides of the package.

In alternative types of packaging having arrays of conductive terminal members other than solder balls, for example pin grid arrays, e.g. those having stubby pins, or land grid array packages, a Faraday shield may be provided by interconnection of a heat spreader or heat slug and selected terminal members, e.g. rows or clusters of terminal members, in an manner analogous to that described above for ball grid array packages.

The packages of the embodiments described above are shown with wire bonded interconnections between bond pads of the integrated circuit chip and conductive elements of the package. Alternative ball grid array package configurations include those in which the chip is interconnected by flip chip or TAB (tape automated bonding) technologies.

The Faraday BGA packages according to the embodiments described above are based on plastic BGA packages using polymer dielectrics. Alternative embodiments are provided based on ceramic BGA structures. Other alternative embodiments are based on metal BGA packages in which the metal substrate forming the heat spreader is grounded as in the embodiments described above, to provide the Faraday shielding.

Thus, it will be appreciated that, while specific embodiments of the invention are described in detail above, numerous variations and modifications of these embodiments fall within the scope of the invention as defined in the following claims.

What is claimed is:

1. A ball grid array package for an integrated circuit comprising a dielectric body, a heat spreader disposed on one side of the dielectric body comprising a layer of a thermally conductive material, the heat spreader also being electrically conductive, the dielectric body surrounding a die attach area on the heatspreader, and providing a plurality of bond pads for wirebonding of the integrated circuit, and interconnection from the bond pads through the dielectric body to a plurality of solder balls of a ball arid array provided on the other side of the dielectric body, and a conductive interconnection provided between the heat spreader and selected solder balls of the ball grid array, for providing a ground connection to the heatstreader through the solder balls.

2. A ball grid array package for an integrated circuit comprising:

a heat spreader comprising a thermally and electrically conductive material;

a body of the package for enclosing an integrated circuit chip in thermal contact with the heat spreader disposed on one side of the body;

and disposed on an opposite side of the body a metallization layer defining conductive leads on which is disposed an array of solder balls, conductive interconnections extending through the body from solder balls of the array to lead bond pads for the integrated circuit;

wherein the improvement comprises a conductive interconnection extending between the heat spreader through the body to selected solder balls the array, for interconnection of the heat spreader to a ground connection through the array of solder balls.

3. A BGA package according to claim 1 wherein selected solder balls comprise an external row of solder balls of the array extending along sides of the array of solder balls.

4. A BGA package according to claim 1 wherein selected solder balls providing for grounding of the heater heat spreader comprise a cluster of solder balls surrounding solder balls for carrying signals.

5. A BGA package according to claim 1 wherein the conductive interconnection comprises a plated through hole extending through the dielectric body and interconnecting the heat spreader and selected solder balls of the array.

6. A BGA package according to claim 1 wherein the conductive interconnection comprises a conductive pin extending through the dielectric body and interconnecting the heat spreader and selected solder balls of the array.

7. A BGA package according to claim 1 wherein the conductive interconnection comprises a side plated interconnection extending over a surface of the dielectric body to interconnect the heat spreader and selected solder balls of the array.

8. A BGA package according to claim 1 wherein the heat spreader comprises a layer of copper or copper alloy extending over a surface of the package.

9. An assembly of a ball grid array package, an integrated circuit, and a substrate comprising a conductive layer providing a ground plane, comprising:

the ball arid array package comprising a dielectric body, an electrically conductive heatspreader disposed on one side of the body, and an array of solder balls disposed on an opposite side of the body, the integrated circuit enclosed by the heatspreader and the dielectric body of the ball grid array package;

and the heat spreader being in thermal contact with the integrated circuit;

conductive interconnections extending from contact pads of the integrated circuit though conductive leads extending through the dielectric body of the ball grid array package to corresponding individual solder balls of an array of solder balls;

each solder ball being conductively interconnected with a corresponding one of an array of bond pads provided on the substrate, and the heat spreader being interconnected through conductive interconnections to selected solder balls connected to the ground plane of the substrate.

10. An assembly according to claim 9 wherein the conductive interconnections between the heat spreader and the selected solder balls comprise plated through holes extending through the dielectric body.

11. An assembly according to claim 9 wherein the conductive interconnections between the heat spreader and the selected solder balls comprise conductive pins extending through the dielectric body.

12. An assembly according to claim 9 wherein the conductive interconnection between the heat spreader and the selected solder balls comprise conductive side plated regions of the dielectric body of the package.

13. A ball grid array package for an integrated circuit comprising a dielectric body, an array of solder balls of a ball grid array disposed on one side of the dielectric body, and a heat spreader comprising a layer of a thermally conductive material disposed on an opposite side of the dielectric body, the heat spreader also being electrically conductive, conductive interconnections extending through the dielectric body from solder balls of the ball grid array to bond pads for interconnecting an integrated circuit within the package, and other conductive interconnections provided between the heat spreader and selected other solder balls of the ball grid array, for providing a ground connection to the heatspreader, the selected other solder balls comprising rows of solder balls around external edges of the ball grid array package surrounding solder balls for interconnection to the integrated circuit.

14. A ball grid array package for an integrated circuit comprising a dielectric body, an array of solder balls of a ball grid array disposed on one side of the dielectric body, and a heat spreader comprising a layer of a thermally conductive material disposed on an opposite side of the dielectric body, the heat spreader also being electrically conductive, conductive interconnections extending through the dielectric body from solder balls of the ball grid array to bond pads for interconnecting an integrated circuit within the package, and other conductive interconnections provided between the heat spreader and selected other solder balls of the ball grid array, for providing a ground connection to the heatspreader, the selected other solder balls comprising a cluster of solder balls arranged around solder balls for carrying signals to the integrated circuit.

\* \* \* \* \*